(12) United States Patent
Iketani

(10) Patent No.: US 6,813,202 B2
(45) Date of Patent: Nov. 2, 2004

(54) SEMICONDUCTOR INTEGRATED CIRCUIT DEVICE CAPABLE OF SHORTENING PERIOD REQUIRED FOR PERFORMING DATA RETENTION TEST

(75) Inventor: Masayuki Iketani, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/619,476

(22) Filed: Jul. 16, 2003

(65) Prior Publication Data

US 2004/0120196 A1 Jun. 24, 2004

(30) Foreign Application Priority Data

Dec. 18, 2002 (JP) ........................................ 2002-366126

(51) Int. Cl.[7] .............................................. G11C 7/00
(52) U.S. Cl. .................... 365/201; 365/189.09; 365/229
(58) Field of Search ........................... 365/201, 189.09, 365/154, 156, 226, 229

(56) References Cited

U.S. PATENT DOCUMENTS

| | | | | |
|---|---|---|---|---|
| 5,469,394 A | * | 11/1995 | Kumakura et al. | 365/201 |
| 5,559,745 A | * | 9/1996 | Banik et al. | 365/201 |
| 5,910,922 A | * | 6/1999 | Huggins et al. | 365/201 |
| 5,936,892 A | * | 8/1999 | Wendell | 365/156 |
| 6,081,464 A | * | 6/2000 | Marr | 365/201 |
| 6,256,241 B1 | * | 7/2001 | Mehalel | 365/201 |
| 6,272,588 B1 | * | 8/2001 | Johnston et al. | 365/201 |
| 6,535,441 B2 | * | 3/2003 | Senda et al. | 365/201 |
| 6,614,701 B2 | * | 9/2003 | Barnes et al. | 365/201 |

FOREIGN PATENT DOCUMENTS

| | | |
|---|---|---|
| JP | 5-101649 | 4/1993 |
| JP | 8-106787 | 4/1996 |

* cited by examiner

Primary Examiner—Trong Phan
(74) Attorney, Agent, or Firm—McDermott, Will & Emery

(57) ABSTRACT

A semiconductor integrated circuit device includes a plurality of memory cells, a first voltage generating circuit for generating a first voltage, a second voltage generating circuit for generating a second voltage lower than the first voltage and a switching circuit for changing over the first and second voltages in response to a control signal so as to output the first and second voltages to the memory cells in a normal operation mode and a data retention test mode, respectively.

5 Claims, 3 Drawing Sheets

SEMICONDUCTOR INTEGRATED CIRCUIT DEVICE CAPABLE OF SHORTENING PERIOD REQUIRED FOR PERFORMING DATA RETENTION TEST

BACKGROUND OF THE INVENTION

1. Field of the Invention

The present invention generally relates to a semiconductor integrated circuit device provided with a plurality of memory cells each including a capacitor and each having a voltage input node and a storage node at opposite sides of the capacitor, respectively and more particularly, to a semiconductor integrated circuit device in which by utilizing coupling effect of the capacitor, a period required for performing a data retention test can be shortened.

2. Description of the Prior Art

When write or read is performed on a plurality of memory cells each including a capacitor, a word line of a selected one of the memory cells is set to high level from low level within a withstand voltage range of 2.7 to 3.6V in the case of a supply voltage of 3V and within a withstand voltage range of 1.6 to 2.3 V in the case of a supply voltage of 1.8V such that an access transistor is turned on. During write, desired low-level or high-level data on a bit line for write is transmitted to a storage node via the access transistor. On the other hand, during read, desired low-level or high-level data stored in the storage node of the memory cell is transmitted to the bit line through the access transistor.

Meanwhile, also outside the withstand voltage range, the memory cell should have a property for retaining data, namely, a data retention property. In case the memory cell has the data retention property, data stored in the memory cell is retained without being contaminated even if a supply voltage of, for example, 3V drops to 2V outside a withstand voltage range of 2.7 to 3.6V. In this case, data written within the withstand voltage range of 2.7 to 3.6V is still retained even at 2V outside the withstand voltage range and can be read within the withstand voltage range.

In an inspection prior to shipment of semiconductor products employing memory cells, a data retention test is performed so as to check whether or not the memory cells have the data retention property. In order to reduce manufacturing costs of the semiconductor products, it is desirable that a period required for performing the data retention test is reduced as much as possible.

However, in a conventional memory cell, even if a supply voltage drops below a withstand voltage range, high level of a storage node does not drop immediately. This is because not only electric charge of the storage node leaks to only a power source but a load transistor leading to the power source has a very high resistance value. As a result, in an inspection prior to shipment of conventional semiconductor products employing memory cells, the period required for performing the data retention test becomes long disadvantageously.

Thus, in order to shorten waiting time of the data retention test, Japanese Patent Laid-pen Publication No. 5101649 (1993), for example, proposes that a parasitic capacity is added between a plate acting as a reference level of the capacitor and the power source. However, this prior art document is different from the present invention in that the prior art document requires addition of the parasitic capacity.

SUMMARY OF THE INVENTION

Accordingly, an essential object of the present invention is to provide, with a view to eliminating the above mentioned drawbacks of prior art a semiconductor integrated circuit device in which high level of a storage node of a memory cell is lowered sharply by coupling effect of a capacitor of the memory cell such that a period required for performing a data retention test can be shortened In order to accomplish this object of the present invention, a semiconductor integrated circuit device according to the present invention includes a plurality of memory cells each of which includes a capacitor and has a voltage input node and a storage node at opposite sides of the capacitor, respectively. A first voltage generating circuit generates a first voltage. A second voltage generating circuit generates a second voltage lower than the first voltage. A switching circuit receives the first and second voltages and changes over the first and second voltages in response to a control signal so as to output the first and second voltages to the voltage input node in a normal operation mode and a data retention test mode, respectively.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

First embodiment

Figure 1:
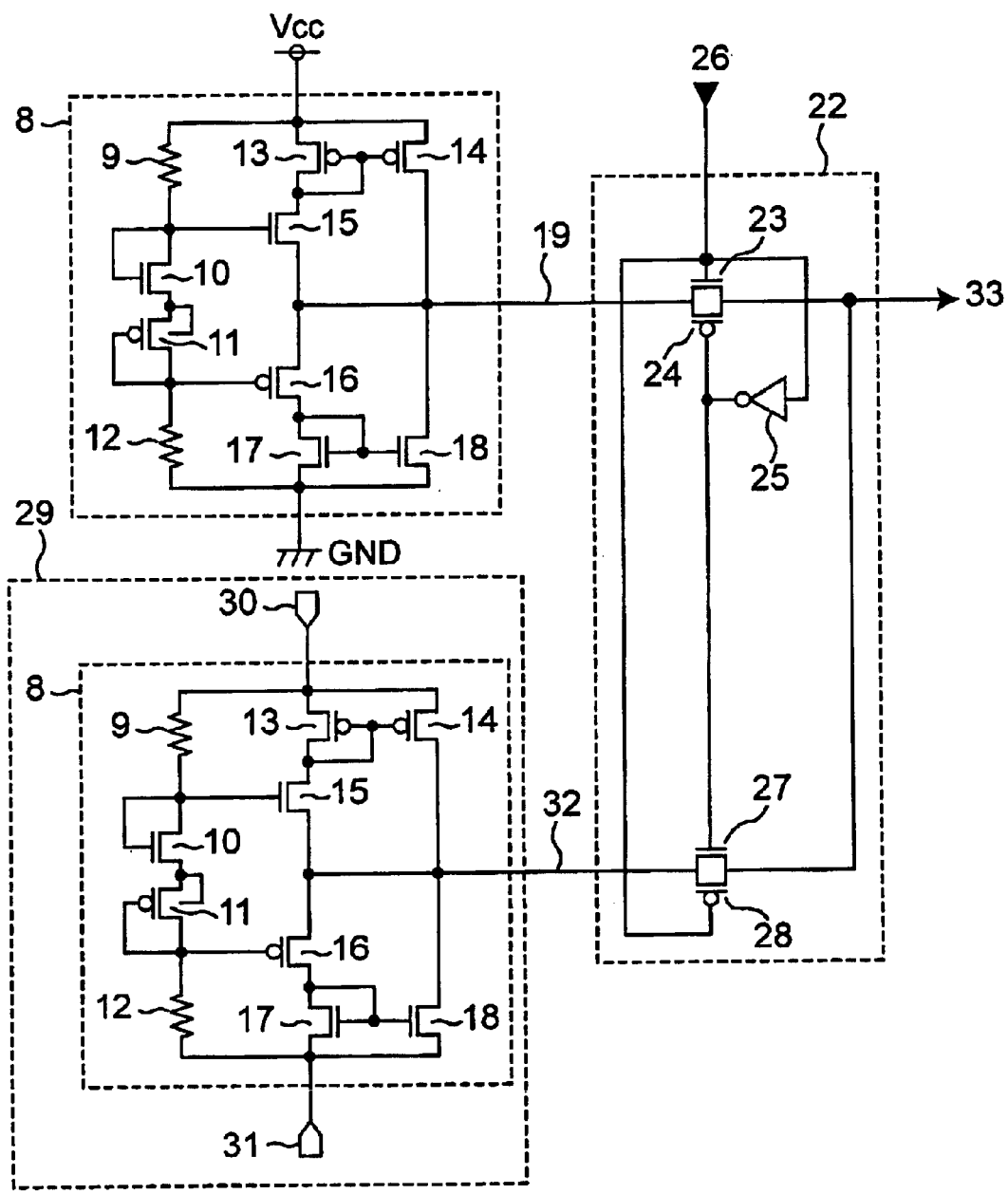
FIG. 1 is a circuit diagram showing a configuration of a semiconductor integrated circuit device according to a first embodiment of the present invention.

FIG. 1 shows a configuration of a semiconductor integrated circuit device according to a first embodiment of the present invention. This semiconductor integrated circuit device has a normal operation mode and a data retention test mode. In FIG. 1, the semiconductor integrated circuit device includes a first voltage generating circuit 8 for generating, in response to a supply voltage Vcc, an output signal 19 having a first voltage (cell plate voltage) of (½ Vcc), a second voltage generating circuit 29 for generating an output signal 32 having a second voltage and a switching circuit 22. The switching circuit 22 changes over the output signals 19 and 32 in response to a control signal 26 so as to apply the output signals 19 and 32 to a memory cell 50 (FIG. 2) in the normal operation mode and the data retention test mode, respectively as an output signal 33.

Figure 2:
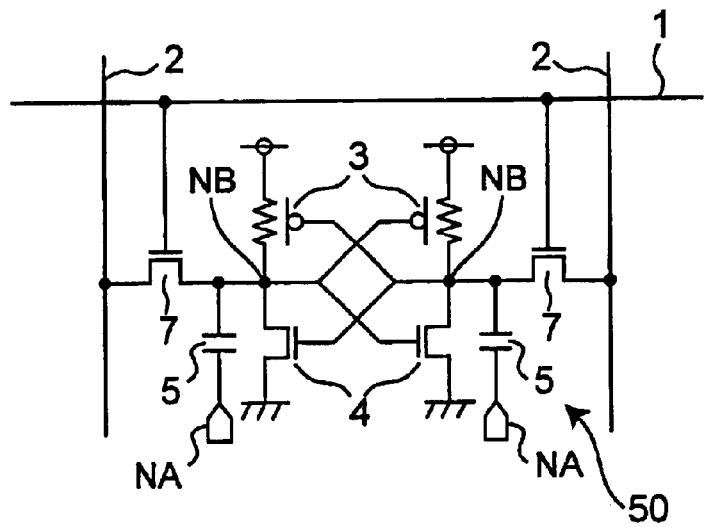
FIG. 2 is a circuit diagram showing a configuration of one of a plurality of memory cells employed in the semiconductor integrated circuit device of FIG. 1.

FIG. 2 shows a configuration of one of a plurality of the memory cells 50 provided in the semiconductor integrated circuit device. Each memory cell 50 includes a pair of capacitors 5 and has a voltage input node NA and a storage node NB at opposite sides of each capacitor 5, respectively. The output signal 33 of the switching circuit 22 of FIG. 1 is applied to the voltage input node NA of the memory cell 50. A word line 1 selects the memory cell 50 and data is outputted from the memory cell 50 to a pair of bit lines 2. The memory cell 50 further includes a pair of load transistors 3 each formed by a thin film transistor, a pair of driver transistors 4 each connected to each of the load transistors 3 at the storage node NB and a pair of access transistors 7 for transmitting to the bit lines 2 data stored in the memory cell 50.

As shown in FIG. 1, the first voltage generating circuit 8 includes a resistance element 9 connected to the supply voltage Vcc, an n-channel MOS transistor 10 connected to the resistance element 9 in series and having a drain and a gate short-circuited to each other, a p-channel MOS transistor 11 having a source connected to a source of the n-channel MOS transistor 10 in series and having a gate and a drain short-circuited to each other, a resistance element 12 having one end connected to the drain of the p-channel MOS transistor 11 and the other end connected to a ground voltage GND and p-channel MOS transistors 13 and 14 having sources connected to each other and gates connected to each other. In the p-channel MOS transistor 13, the gate and a drain are short-circuited to each other.

The first voltage generating circuit 8 further includes an n-channel MOS transistor 15 and a p-channel MOS transistor 16. The n-channel MOS transistor 15 has a drain connected to the drain of the p-channel MOS transistor 13, a gate connected to the drain of the n-channel MOS transistor 10 and a source connected to the output signal 19. The p-channel MOS transistor 16 has a source connected to the output signal 19 and a gate connected to the drain of the p-channel MOS transistor 11.

The first voltage generating circuit 8 further includes n-channel MOS transistors 17 and 18. A drain and a gate of the n-channel MOS transistor 17 are connected to a drain of the p-channel MOS transistor 16 and a source of the n-channel MOS transistor 17 is connected to the ground voltage GND. Meanwhile, the n-channel MOS transistor 18 has a gate connected to a short-circuiting node of the gate and the drain of the n-channel MOS transistor 17, a drain connected to the output signal 19 and a source connected to the ground voltage GND. The output signal 19 of the first voltage generating circuit 8 has the first voltage of (½ Vcc). A current mirror circuit is formed by the p-channel MOS transistors 13 and 14 and the n-channel MOS transistors 17 and 18.

The first voltage generating circuit 8 of the above described configuration is operated as follows. Supposing that the n-channel MOS transistor 15 and the p-channel MOS transistor 16 have threshold voltages VthN and VthP, respectively, the gate of the n-channel MOS transistor 15 is set at a voltage level of (½ Vcc+VthN) and the gate of the p-channel MOS transistor 16 is set at a voltage level of (½ Vcc−VthP). As described later, electric current of the transistors 15 and 16 changes according to voltage level of the output signal 19.

By the changing electric current of the transistors 15 and 16, voltage levels of the drains of the transistors 15 and 16 are determined. The current mirror circuit having the p-channel MOS transistors 13 and 14 and the n-channel MOS transistors 17 and 18 operate so as to stabilize the voltage level of the output signal 19. For example, in case the voltage level of the output signal 19 has dropped below (½ Vcc), electric current flows through the n-channel MOS transistor 15, so that drain voltage of the N-channel MOS transistor 15, namely, gate voltage of the p-channel MOS transistors 13 and 14 drops and thus, electric current flows from the supply voltage Vcc to the output signal 19 via the p-channel MOS transistor 14. As a result, the lowered voltage level of the output signal 19 rises.

On the contrary, in case the voltage level of the output signal 19 has risen above (½ Vcc), electric current flows through the p-channel MOS transistor 16, so that drain voltage of the p-channel MOS transistor 16, namely, gate voltage of the n-channel MOS transistors 17 and 18 rises and thus, electric current flows from the output signal 19 to the ground voltage GND through the n-channel MOS transistor 18. As a result, the raised voltage level of the output signal 19 drops. By the above described operation of the first voltage generating circuit 8, the voltage level of the output signal 19 is stabilized at (½ Vcc). The first voltage of (½ Vcc) of the output signal 19 of the first voltage generating circuit 8 is used as a cell plate voltage of the voltage input node NA of the memory cell 50 of FIG. 2.

In the semiconductor integrated circuit device of FIG. 1, the switching circuit 22 includes an n-channel MOS transistor 23, a p-channel MOS transistor 24, an n-channel MOS transistor 27, a p-channel MOS transistor 28 and an inverter 25. A drain and a source of each of the n-channel MOS transistor 23 and the p-channel MOS transistor 24 are, respectively, connected to the output signal 19 of the first voltage generating circuit 8 and the output signal 33 of the switching circuit 22. A drain and a source of each of the n-channel MOS transistor 27 and the p-channel MOS transistor 28 are, respectively, connected to the output signal 32 of the second voltage generating circuit 29 and the output signal 33 of the switching circuit 22. An input of the inverter 25 receives the control signal 26 and an output of the inverter 25 controls gates of the p-channel MOS transistor 24 and the n-channel MOS transistor 27. A gate of the p-channel MOS transistor 28 is controlled by the control signal 26.

In the semiconductor integrated circuit device of FIG. 1, since the second voltage generating circuit 29 has a configuration in which a terminal 30 having a voltage level of (½ Vcc) and a terminal 31 having a voltage level of (−½ Vcc) are added to the first voltage generating circuit 8, voltage level of the output signal 32 of the second voltage generating circuit 29 is stabilized at the ground voltage GND. The switching circuit 22 changes over the output signal 19 of the first voltage generating circuit 8 and the output signal 32 of the second voltage generating circuit 29 in response to the control signal 26 so as to apply the output signal 33 to the voltage input node NA of the memory cell 50.

For example, when the semiconductor integrated circuit device is in the normal operation mode, the control signal 26 is set to high level, so that the transistors 23 and 24 are turned on and the transistors 27 and 28 are turned off and thus, the output signal 19 having the voltage level of (½ Vcc) is applied, as the output signal 33, from the switching circuit 22 to the voltage input node NA of the memory cell 50. On the other hand, when the semiconductor integrated circuit device is in the data retention test mode, the control signal 26 is set to low level, so that the transistors 23 and 24 are turned off and the transistors 27 and 28 are turned on and thus, the output signal 32 having the ground voltage GND is applied, as the output signal 33, from the switching circuit 22 to the voltage input node NA of the memory cell 50.

Figure 3:
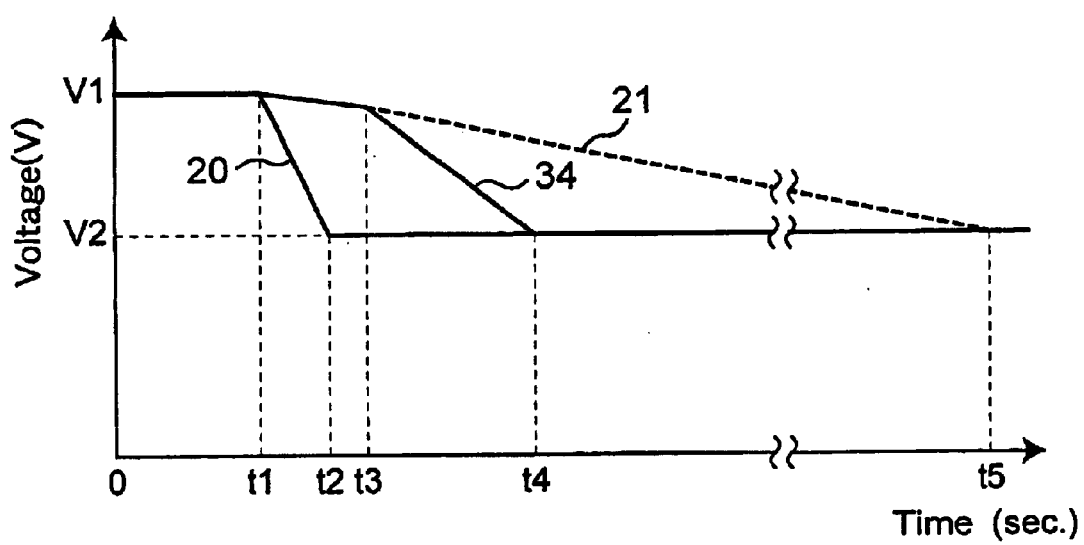
FIG. 3 is a graph showing operation of the memory cell of FIG. 2.

Operation of the memory cell 50 is described below in association with the above mentioned operation of the switching circuit 22 with reference to a graph of FIG. 3 having an abscissa axis indicative of time and an ordinate axis indicative of voltage. The graph of FIG. 3 shows changes of supply voltage 20 of the memory cell 50 and high level 34 of the storage node NB of the memory cell 50 with time in comparison with high level 21 of a storage node of a conventional memory cell. In an interval from a time point 0 to a time point t1, the supply voltage 20 falling within a withstand voltage range of the memory cell 50 and the high level 21 of the storage node NB assume an identical high voltage V1.

In an interval from the time point t1 to a time point t2, the supply voltage 20 of the memory cell 50 drops greatly from the high voltage V1 to a low voltage V2 but the high level 34 of the storage node NB shifts to a voltage slightly lower than the high voltage V1 without being capable of following up the supply voltage 20 of the memory cell 50. At a time point t3, the control signal 26 of the switching circuit 22 is set to low level from high level. The supply voltage 20 of the memory-cell 50 is maintained at the low voltage V2 until a time point t5. However, the high level 34 of the storage node NB shifts to the low voltage V2 at a time point t4. On the other hand, the high level 21 of the storage node of the conventional memory cell reaches the low voltage V2 at a time point t5.

This phenomenon happens for the following reason. In the present invention, since the output signal 33 of the switching circuit 22 of FIG. 1 changes from the voltage of (½ Vcc) to the ground voltage GND at the time point t3, the high level 34 of the storage node NB rapidly drops to the low voltage V2 due to coupling effect of the capacitor 5. Namely, conventionally, electric charge leaks to the supply voltage Vcc little by little by way of the load transistor 3. On the other hand, in the present invention, electric charge can rapidly change the level of the storage node NB of the memory cell 50 due to coupling effect of the capacitor 5.

In this embodiment, since the switching circuit 22 changes over the output signal 19 of the first voltage generating circuit 8 and the output signal 32 of the second voltage generating circuit 29 in response to the control signal 26 set to high level and low level in the normal operation mode and the data retention test mode, respectively so as to apply, as the output signal 33, the output signals 19 and 32 to the voltage input node NA of the memory cell 50 in the normal operation mode and the data retention test mode, respectively, the level of the storage node NB of the memory cell 50 can be changed rapidly and thus, a period required for performing a data retention test can be shortened.

Second Embodiment

Figure 4:
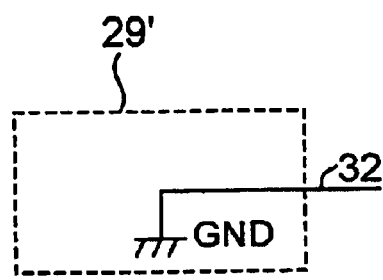
FIG. 4 is a circuit diagram showing a configuration of a second voltage generating circuit employed in a semiconductor integrated circuit device according to a second embodiment of the present invention.

FIG. 4 shows a configuration of a second voltage generating circuit 29' employed in a semiconductor integrated circuit device according to a second embodiment of the present invention. The second voltage generating circuit 29' of FIG. 4 is formed by a ground power source having the ground voltage GND. Since other configurations of this semiconductor integrated circuit device are similar to those of the semiconductor integrated circuit device of FIG. 1, the description is abbreviated for the sake of brevity.

In this embodiment, since the second voltage generating circuit 29' is formed by the ground power source, the second voltage generating circuit 29' can operate safely without failures and layout area of the circuit can be reduced in addition to the effect of the first embodiment that the period required for performing the data retention test can be shortened.

Third Embodiment

Figure 5:
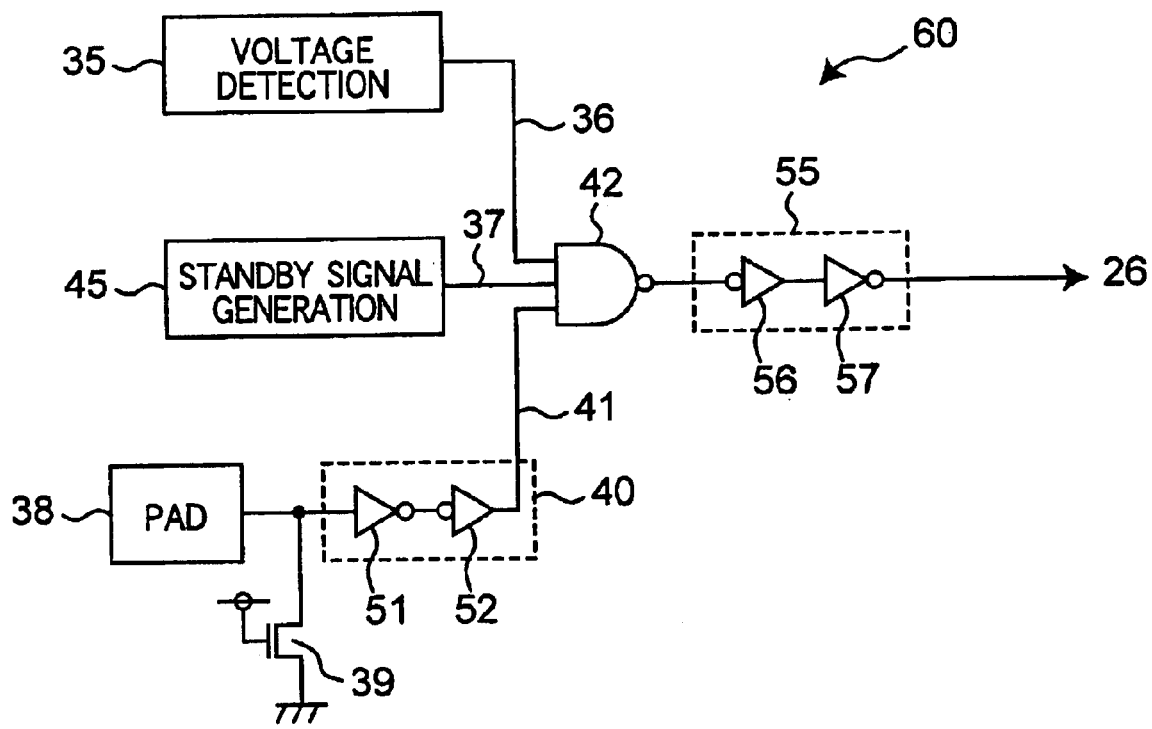
FIG. 5 is a circuit diagram showing a configuration of a control circuit employed in a semiconductor integrated circuit device according to a third embodiment of the present invention.

FIG. 5 shows a configuration of a control circuit 60 for generating the control signal 26 of FIG. 1, which is employed in a semiconductor integrated circuit device according to a third embodiment of the present invention. The control signal 60 includes a voltage detecting circuit 35, a standby signal generating circuit 45 for outputting a standby signal 37 indicative of a standby state in the data retention test mode and a pad 38. The voltage detecting circuit 35 detects a supply voltage in the data retention test mode and outputs a voltage signal 36 indicative of the supply voltage. The pad 38 is connected to an external no-connect (NC) pin (not shown) and outputs via a buffer 40 a test mode signal 41 indicative of the data retention test mode.

The buffer 40 includes a positive logic inverter 51 and a negative logic inverter 52. An n-channel MOS transistor 39 can fix a node of the external NC pin to low level and receives the supply voltage Vcc. The n-channel MOS transistor 39 is connected to a junction of the pad 38 and the buffer 40. The control circuit 60 further includes a 3-input NAND gate 42. The 3-input NAND gate 42 receives the voltage signal 36, the standby signal 37 and the test mode signal 41 so as to output the control signal 26 through a buffer 55. The buffer 55 includes a negative logic inverter 56 and a positive logic inverter 57.

The control circuit 60 of the above described configuration is operated as follows. When a high-level signal has been inputted to the pad 38 from the external NC pin, the high-level test mode signal 41 is inputted to the 3-input NAND gate 42 via the buffer 40. Meanwhile, the 3-input NAND gate 42 receives the high-level standby signal 37. Furthermore, the voltage signal 36 received by the 3-input NAND gate 42 from the voltage detecting circuit 35 is changed over so as to be set to low level and high level in case the supply voltage falls within the withstand voltage range and is the low voltage in the data retention test mode, respectively In the data retention test mode, since all the signals 36, 37 and 41 are at high level, the 3-input NAND gate 42 outputs the low-level control signal 26 by way of the buffer 55. In response to the low-level control signal 26, since the switching circuit 22 applies the output signal 32 corresponding to the data retention test mode, to the voltage input node NA of the memory cell 50 as the output signal 33, the level of the storage node NB of the memory cell 50 can be changed rapidly, so that the period required for performing the data retention test can be shortened. On the contrary, except for a case in which all the signals 36, 37 and 41 are at high level, the control circuit 60 outputs the high-level control signal 26, so that the switching circuit 22 applies, in response to the high-level control signal 26, the output signal 19 corresponding to the normal operation mode, to the voltage input node NA of the memory cell 50 as the output signal 33.

In this embodiment, since the 3-input NAND gate 42 performs logic operation of at least the voltage signal 36 and the standby signal 37 or the voltage signal 36, the standby signal 37 and the test mode signal 41 so as to output the control signal 26, the switching circuit 22 positively changes over the output signals 19 and 32 on the basis of the control signal 26, so that malfunctions of the semiconductor integrated circuit device can be prevented beforehand.

Meanwhile, in the first to third embodiments, a case in which the capacitor is used for an SRAM type memory cell is described. Alternatively, the present invention may also be applied to a capacitor of a DRAM.

As is clear from the foregoing description, the semiconductor integrated circuit device of the present invention includes a plurality of the memory cells each of which includes the capacitor and has the voltage input node and the storage node at the opposite sides of the capacitor, respectively, the first voltage generating circuit for generating the first voltage, the second voltage generating circuit for generating the second voltage lower than the first voltage and the switching circuit which receives the first and second voltages and changes over the first and second voltages in response to the control signal so as to output the first and second voltages to the voltage input node in the normal operation mode and the data retention test mode, respectively.

Therefore, in the present invention, since the switching circuit changes over the first and second voltages in response to the control signal so as to output the first and second voltages to the voltage input node of each of the memory cells as the output signal, the level of the storage node of each of the memory cells can be changed rapidly, so that such a marked effect is gained that the period required for performing the data retention test can be shortened.

What is claimed is:

1. A semiconductor integrated circuit device comprising:
   a plurality of memory cells each of which includes a capacitor and has a voltage input node and a storage node at opposite sides of the capacitor, respectively;
   a first voltage generating circuit for generating a first voltage;
   a second voltage generating circuit for generating a second voltage lower than the first voltage; and
   a switching circuit which receives the first and second voltages and changes over the first and second voltages in response to a control signal so as to output the first and second voltages to the voltage input node in a normal operation mode and a data retention test mode, respectively.

2. The semiconductor integrated circuit device according to claim 1, wherein the second voltage generating circuit is formed by a ground power source.

3. The semiconductor integrated circuit device according to claim 1, further comprising:
   a control circuit for generating the control signal;
   wherein the control circuit includes a voltage detecting circuit for detecting a supply voltage in the data retention test mode so as to output a voltage signal indicative of the supply voltage, a standby signal generating circuit for generating a standby signal indicative of a standby state in the data retention test mode and a logic circuit for performing logic operation of at least the voltage signal and the standby signal.

4. The semiconductor integrated circuit device according to claim 3, wherein the control circuit further includes a test mode signal generating circuit for generating a test mode signal indicative of the data retention test mode and the logic circuit is formed by a 3-input NAND gate for performing logic operation of the voltage signal, the standby signal and the test mode signal.

5. The conductor integrated circuit device according to claim 1, wherein each of the memory cells includes a pair of bit lines, a word line traversing the bit line, a pair of access transistors disposed between the bit lines such that each of the access transistors is connected between each of the bit lines and the storage node and has a gate connected to the word line, a pair of the capacitors each connected to a junction of each of the access transistors and the storage node, a pair of load transistors each connected between a power source and the storage node and a pair of driver of driver transistors each connected between the storage node and ground such that a gate of each of the load transistors is connected to a gate of each of the driver transistors.

* * * * *